United States Patent [19]

Nishizuka

[11] 4,321,541
[45] Mar. 23, 1982

[54] CELL CAPACITY DETECTOR

[75] Inventor: Akihiro Nishizuka, Tokyo, Japan

[73] Assignee: Tokyo Shibaura Denki Kabushiki Kaisha, Japan

[21] Appl. No.: 99,746

[22] Filed: Dec. 3, 1979

[30] Foreign Application Priority Data

Dec. 4, 1978 [JP] Japan .................................. 53/149046

[51] Int. Cl.³ ............................................ G01N 27/42
[52] U.S. Cl. ..................................... 324/426; 324/429
[58] Field of Search ................. 324/429, 427, 430, 426

[56] References Cited

U.S. PATENT DOCUMENTS

| 2,951,199 | 8/1960 | Dawkins .............................. 324/429 |
| 3,898,790 | 8/1975 | Takamune et al. . |
| 4,010,456 | 3/1977 | Erni . |
| 4,020,414 | 4/1977 | Paredes . |
| 4,024,415 | 5/1977 | Matsuura . |
| 4,037,399 | 7/1977 | Chihara . |
| 4,052,717 | 10/1977 | Arnold et al. . |
| 4,074,515 | 2/1978 | Asano . |
| 4,080,560 | 3/1978 | Abert .................................. 324/429 |

Primary Examiner—Michael J. Tokar
Attorney, Agent, or Firm—Finnegan, Henderson, Farabow, Garrett & Dunner

[57] ABSTRACT

A capacity detector of a cell used as a source of power for a watch, camera or any other portable implement, wherein a resistive load is connected in series through a switch; the switch is opened immediately after a prescribed length of time; a speed of the cell voltage restoration is calculated which is required for a cell voltage restored after the opening of the switch to be brought back to a prescribed reference level; and the remaining capacity of the cell is numerically determined from said calculated length of time.

10 Claims, 24 Drawing Figures

FIG. 8A
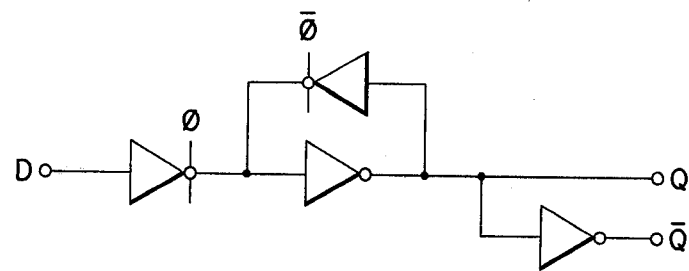
FIG. 8B
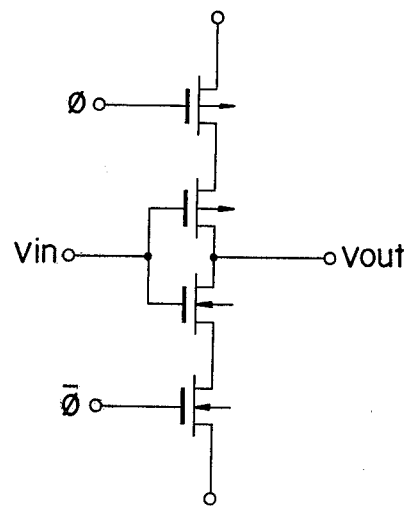
FIG. 9
| ∅ | D | Qn |
|---|---|-----|
| 0 | — | Qn−1 |
| 1 | 0 | 0 |
| 1 | 1 | 1 |

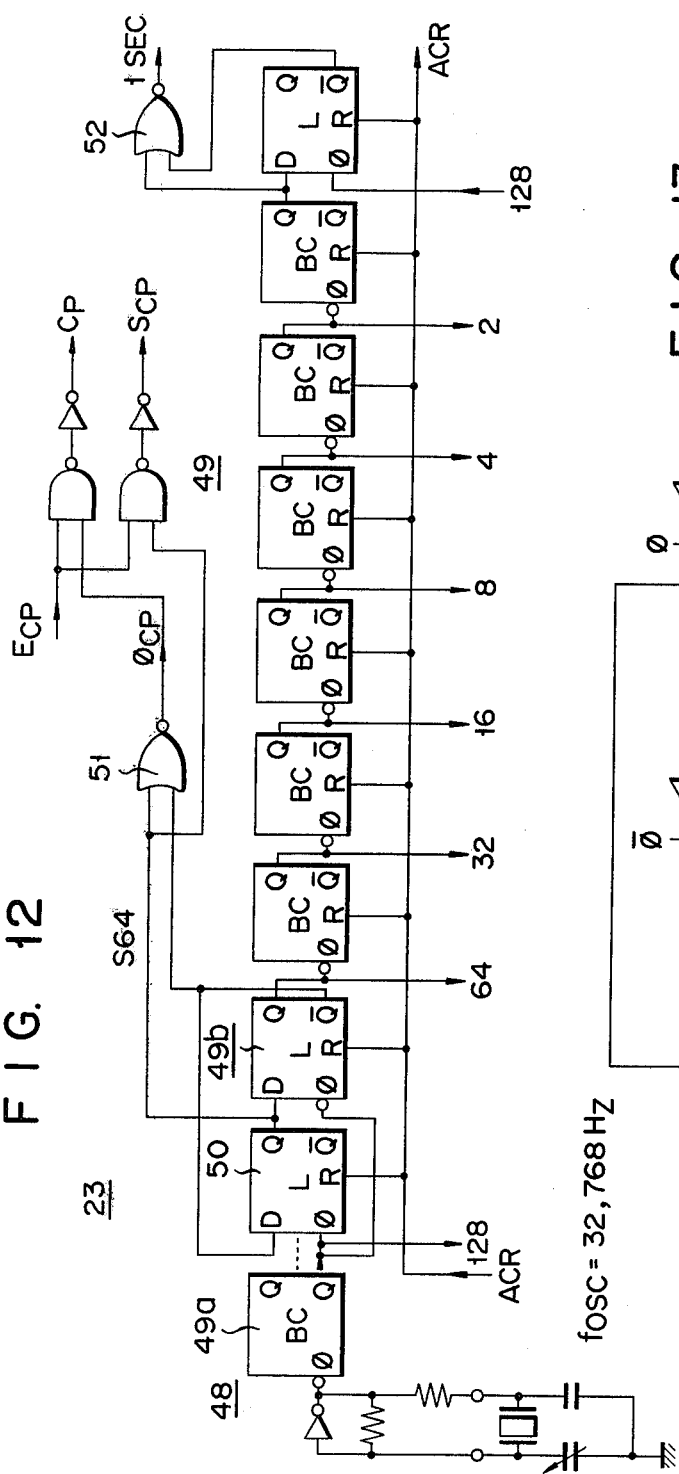
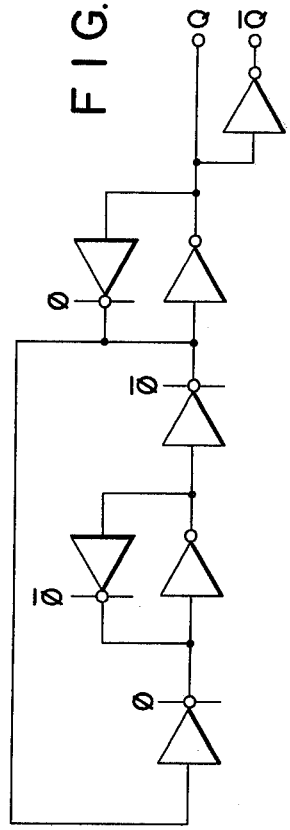

FIG. 20
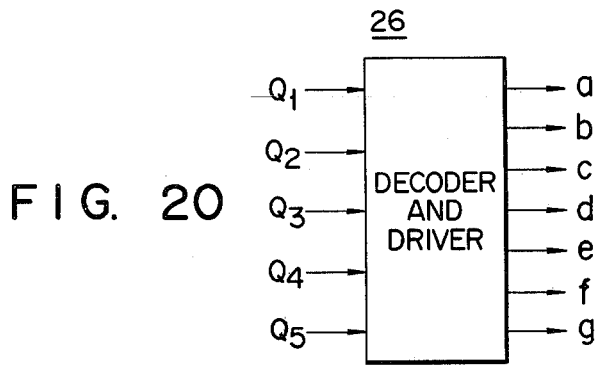
FIG. 21
| PULSE NUMBER | Q5 | Q4 | Q3 | Q2 | Q1 | a | b | c | d | e | f | g | INDICATOR |
|---|---|---|---|---|---|---|---|---|---|---|---|---|---|
| 0  | 0 | 0 | 0 | 0 | 0 | 1 | 0 | 0 | 1 | 1 | 1 | 1 | E |
| 1  | 0 | 0 | 0 | 0 | 1 | 0 | 1 | 1 | 0 | 0 | 0 | 0 | 1 |
| 2  | 0 | 0 | 0 | 1 | 0 | 1 | 1 | 0 | 1 | 1 | 0 | 1 | 2 |
| 3  | 0 | 0 | 0 | 1 | 1 | 1 | 1 | 1 | 1 | 0 | 0 | 1 | 3 |
| 4  | 0 | 0 | 1 | 0 | 0 | 0 | 1 | 1 | 0 | 0 | 1 | 1 | 4 |
| 5  | 0 | 0 | 1 | 0 | 1 | 1 | 0 | 1 | 1 | 0 | 1 | 1 | 5 |
| 6  | 0 | 0 | 1 | 1 | 0 | 1 | 0 | 1 | 1 | 1 | 1 | 1 | 6 |
| 7  | 0 | 0 | 1 | 1 | 1 | 1 | 1 | 1 | 0 | 0 | 0 | 0 | 7 |
| 8  | 0 | 1 | 0 | 0 | 0 | 1 | 1 | 1 | 1 | 1 | 1 | 1 | 8 |
| 9  | 0 | 1 | 0 | 0 | 1 | 1 | 1 | 1 | 1 | 0 | 1 | 1 | 9 |
| 10 | 0 | 1 | 0 | 1 | 0 | 1 | 0 | 0 | 0 | 1 | 1 | 1 | F |
| 11 | 0 | 1 | 0 | 1 | 1 | 1 | 0 | 0 | 0 | 1 | 1 | 1 | F |
| 12 | 0 | 1 | 1 | 0 | 0 | 1 | 0 | 0 | 0 | 1 | 1 | 1 | F |
| 13 | 0 | 1 | 1 | 0 | 1 | 1 | 0 | 0 | 0 | 1 | 1 | 1 | F |
| 14 | 0 | 1 | 1 | 1 | 0 | 1 | 0 | 0 | 0 | 1 | 1 | 1 | F |
| 15 | 0 | 1 | 1 | 1 | 1 | 1 | 0 | 0 | 0 | 1 | 1 | 1 | F |
| 16 | 1 | 0 | 0 | 0 | 0 | 1 | 0 | 0 | 0 | 1 | 1 | 1 | F |
FIG. 22
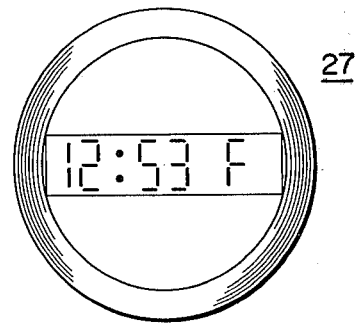

Patent Number: 4,321,541

CELL CAPACITY DETECTOR

BACKGROUND OF THE INVENTION

This invention relates to a circuit for determining the capacity of a cell carried, for example, on an electronic wrist watch, and more particularly to a circuit for successively indicating the remaining capacity of such cell in the form of digital and/or analogue values.

Recently in the field of watches or cameras, a widespread tendency appears toward the use of electronic systems. This tendency probably has resulted from the possibility of easily integrating a great variety of complicated circuits in a square semiconductor substrate, each side of which measures only a few millimeters.

A watch or camera comprising intricate integrated electronic circuits naturally has to be supplied with a power source. Since the watch or camera is portable, a primary cell such as a silver oxide type has come into general use. Application of the primary cell to the portable watch or camera necessarily involves the exchange of power cells. Accordingly, the user of such watch or camera must have the primary cell used therewith periodically replaced by a fresh one according to the consumed capacity of the cell or the length of time for which the cell has been used. Consequently, the manufacture of, for example, a portable watch incorporates an abnormal voltage detector, an example of which is shown in FIG. 1, for the easy check of the voltage limit of the primary cell.

Referring to FIG. 1, the prior art cell capacity detector comprises a switch (2), a light-emitting diode (3) and current control resistor (4) connected in series relative to the primary cell (1). Where the light-emitting diode (3) sends forth a light at the short-circuiting of the switch (2), then the primary cell (1) is taken to have a normal level of voltage. Conversely, where the light-emitting diode (3) fails to be lighted at the short-circuiting of the switch (2), then the primary cell (1) is regarded as having an insufficient level of voltage. Such a cell must be replaced by a fresh one.

Referring to the prior art cell capacity detector of FIG. 1, the light-emitting diode (3) has a voltage (V)-current (I) curve (5) (FIG. 2). The current control resistor (4) and load line (6) have such a relationship as allows for the flow of diode current ($I_{LED}$) indicated at a junction (7) (FIG. 2). The curve diagram of FIG. 2 shows that where a power source voltage ($|V_{SS}|$) is higher than the forward voltage ($V_F$) of the light-emitting diode (3), then a sufficiently large current ($I_D$) runs through said light-emitting diode (3) to cause it to send forth a light; and conversely where the power source voltage ($|V_{SS}|$) is lower than the forward voltage ($V_F$) of the light-emitting diode (3), then said diode (3) fails to be lighted, indicating that the power source voltage ($|V_{SS}|$) has fallen.

As seen from FIG. 3, the cell capacity detector may be formed of a CMOS inverter (10), consisting of a P channel transistor (8), and an N channel transistor (9), and a bias circuit (13), formed of a bias resistor (11) and a bias N channel transistor (12).

With the cell capacity detector of FIG. 3, the CMOS inverter (10) has a specific threshold voltage. Now let it be assumed that the threshold of inverter (10) is preset to distinguish between the normal and abnormal voltages with the value of said threshold voltage taken to correspond to the output voltage of the primary cell (1). The gate of, for example, the bias N channel transistor (12) is connected to one power source ($V_{DD}$). Consequently in the bias circuit (13), connected to the P channel transistor (8) and N channel transistor (9) constituting the inverter (10), the voltage ($V_{GS}$) of the gate of said bias N channel transistor (12) successively changes in accordance with the attenuation of the capacity of the primary cell (1), which corresponds to the attenuation of the voltage impressed between the power sources $V_{DD}$ and $V_{SS}$. Resistance between the source and drain regions of the bias N channel transistor (12) varies with the above-mentioned gate voltage ($V_{GS}$), thereby ensuring the automatic change of the bias voltage of the inverter (10).

Where, with the cell capacity detector of FIG. 3, the primary cell (1) has a normal level of voltage, then the resistance occurring between the source and drain regions of the bias N channel transistor (12), in cooperation with bias resistor (11), generates at point A (the input terminal of the inverter (10)) a voltage which renders the N channel transistor (9) non-conducting and the P channel transistor (8) conducting. As a result, a normal voltage signal denoting the voltage level of the power source $V_{DD}$ is sent forth from an output terminal (14).

Where the voltage of the primary cell (1) falls to an abnormally low level, then the resistance appearing between the source and drain regions of the bias N channel transistor (12) increases because the voltage impressed on the gate of said transistor (12) is attenuated to a low level. Therefore, the bias voltage impressed at point A renders the P channel transistor (8) nonconducting and the N channel transistor (9) conducting. Thus, a signal denoting the voltage level of the power source $V_{SS}$ is produced from the output terminal (14) to indicate that the voltage of the primary cell (1) has fallen to an abnormally low level.

The curve diagram of FIG. 4 is furnished for easy understanding of the operation of the bias circuit (13). FIG. 4 indicates a typical $V_{DS}$-$I_D$ curve, where the gate voltage $V_{GS}$ of the N channel transistor (12) is varied. $V_{DS}$ represents the source-drain voltage of the transistor (12), and $I_D$ denotes the drain current thereof. The straight line (l) denotes a load line resulting from a load resistor (11) and shows that actual power source voltage $V_{DS}$ is produced at the junctions between said straight line (l) and the curves. Now let it be assumed that the threshold voltage of the inverter (10) is set at 0.7 volt (in FIG. 3, voltage $V_D$ impressed across both ends of the bias resistor (11) is taken to be 0.7 V); and the cell capacity detector circuit is supplied with a power source voltage of 1.40 volts. This means that the gate of the transistor (12) has been impressed with a voltage of $|V_{GS}| = 1.40$.

If the fall of the voltage $|V_{GS}|$ to a lower level than 1.40 volts is taken to denote the occurrence of abnormal voltage, and it is desired that the inverter (10) change states at the occurrence of said abnormally low voltage, then the load resistor (11) should be adjusted to provide a voltage of $|V_{DS}| = |V_{SS}| - |V_D| = 1.40 - 0.7 = 0.7$ volt in view of the relationship $|V_{SS}| = |V_D| + |V_{DS}|$. Consequently, said adjustment should be made at point P.

Now let it be assumed that with the bias circuit in which the voltage has been adjusted as described above, the power source voltage has a normal level of, for example, 1.50 volts. Then junction R between the curve representing $|V_{GS}| = 1.50$ and load line (l') set in parallel with load line (l) can be supplied with a voltage of 0.55 volt. Therefore, the voltage $V_D$ impressed across both ends of the bias resistor (11) is set at 1.50−0.55=0.95 volt. As a result, the gate (G) of the inverter (10) is impressed with a voltage of −0.95 volt, and a signal denoting a normal voltage ($V_{DD}$) is sent forth from the output terminal (14) of the inverter (10). Conversely, where the gate voltage $V_{GS}$ of the inverter (10) indicates $|V_{GS}| \approx 1.30$, then voltage $V_{DS}$ is set at 0.8 volt, and consequently voltage $V_D$ shows a level of 1.30−0.8=0.5. As a result, the N channel transistor (9) is rendered conducting, and a signal having voltage ($V_{SS}$), which denotes the abnormal condition of the capacity of the primary cell (1), is produced from the output terminal (14) of the inverter (10).

However, the known cell voltage detectors respectively arranged as shown in FIGS. 1 and 3 have the drawback that the user of, for example, a portable watch is only informed of the normal or abnormal level of the voltage of a cell used with the watch.

In other words, the voltage detector of the above-mentioned type only suddenly informs the user of, for example, a portable watch that the voltage of a cell used therewith has dropped to a lower level than required. Where the user notices such event in the surroundings in which the cell can not be immediately replaced, for example, during a trip or mounting climbing, he finds great difficulties in coping with such situation.

The conventional cell voltage detector does not show how much the capacity of a cell used with, for example, a portable watch has been consumed. Even where 90% and 70% of the cell capacity have been used up, the conventional cell voltage detector indicates this as normal. When the conventional voltage detector displays the abnormal voltage drop of a cell used with a portable watch, then the depleted cell must be immediately replaced. Otherwise, the watch would be stopped.

SUMMARY OF THE INVENTION

It is accordingly an object of this invention to provide a cell capacity detector which can accurately determine the remaining capacity of a cell used as a power source with a portable implement such as a watch or camera.

Another object of the invention is to provide a cell capacity detector which not only efficiently detects the remaining capacity of the cell, but also immediately indicates a detection signal in the analogue or digital form.

Another object of the invention is to provide a cell capacity detector which informs the user of a limit to the application of a cell, namely, indicates the critical voltage at which said cell capacity detector ceases to function.

Still another object of the invention is to provide a cell capacity detector which comprises:

a cell acting as a power source having a prescribed voltage level;

load means connected in series to the cell;

switch means which is connected between the cell and load means, remains closed for a prescribed length of time to supply current to the load means and is later opened to shut off current;

first detector means which detects a voltage impressed between both power supply terminals of the cell in response to an output signal from the switch means; and second detector means which detects a speed of the cell voltage restoration after the opening of the switch means in response to output signals from the switch means and first detector means.

BRIEF DESCRIPTION OF THE DRAWING

FIGS. 8A and 8B show the logic circuits included in the detection circuit of FIG. 7;

FIG. 9 is a truth table for the logic gate shown in FIG. 8A;

FIG. 12 indicates the clock pulse generator included in the cell capacity detector of FIG. 6;

FIGS. 13 and 14 set forth the gates of the logic circuits used with the clock pulse generator of FIG. 12;

FIG. 20 is a block diagram showing the manner in which the decoder and driver included in the cell capacity detector of FIG. 6 receives and transmits signals;

FIG. 21 shows the relationships of the binary arrangements of signals supplied to and transmitted from the decoder and driver of FIG. 20;

FIG. 22 illustrates a display device used with the cell capacity detector of FIG. 6.

DETAILED DESCRIPTION OF THE PREFERRED EMBODIMENTS

Figure 1:
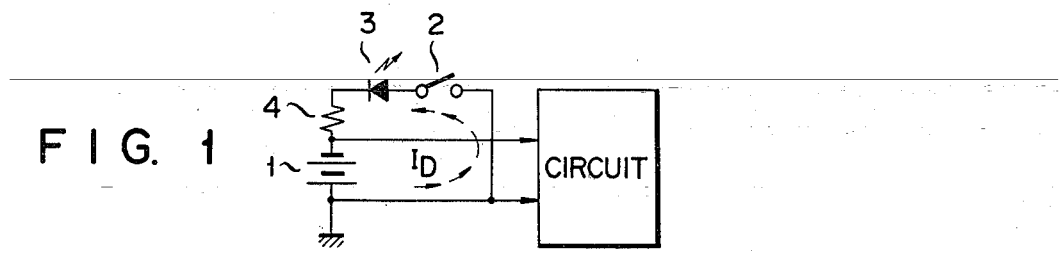
FIG. 1 shows the arrangement of a prior art abnormal voltage drop detector using a light-emitting diode (hereinafter abbreviated as "LED")
Figure 2:
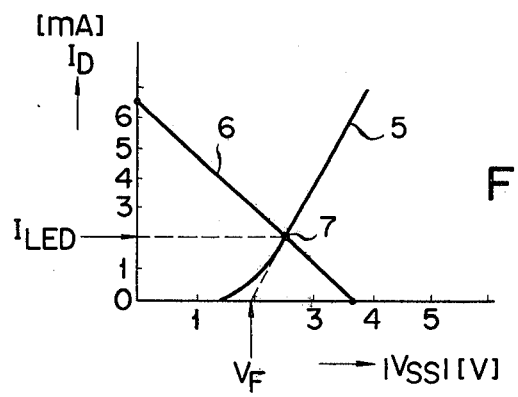
FIG. 2 is a diagram of the voltage-current relationship of an LED for illustrating the function of the prior art cell capacity detector.
Figure 3:
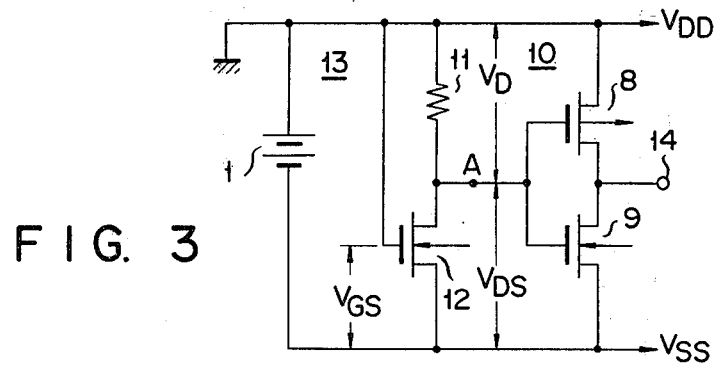
FIG. 3 indicates the arrangement of the conventional cell capacity detector using a complementary MOS inverter.
Figure 4:
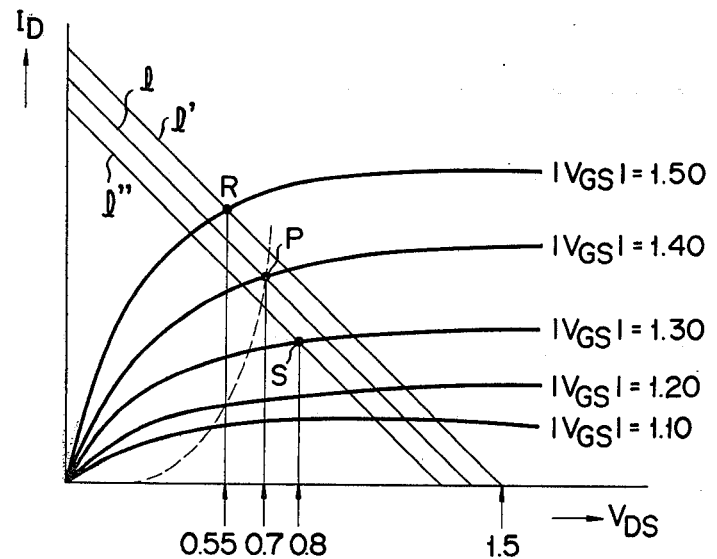
FIG. 4 is a diagram with voltage-current curves for an N channel MOS transistor.
Figure 5:
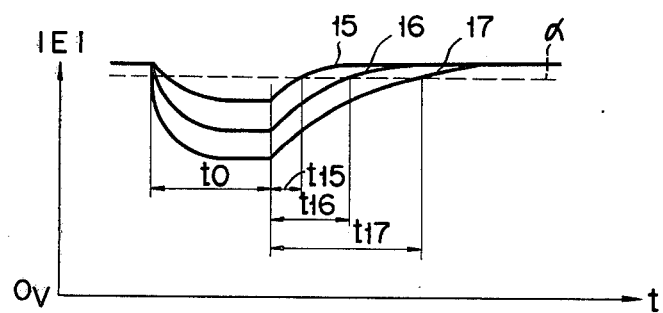
FIG. 5 is a diagram showing the attenuation and restoration of cell voltage to indicate the function of a cell capacity detector embodying this invention.

For better understanding of the object and arrangement of a cell capacity detector embodying this invention, description is given of the principle on which the invention is based by reference to FIG. 5 and also of the preferred embodiments of the invention by reference to FIGS. 6 to 23.

Figure 6:
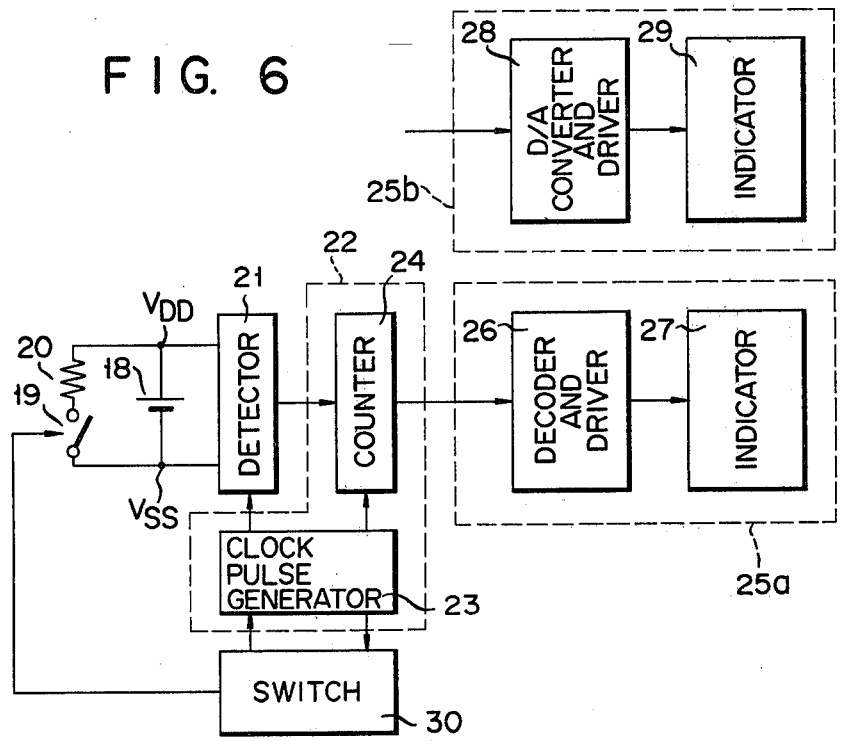
FIG. 6 is a block circuit diagram of the cell capacity detector of the invention.

FIG. 5 illustrates the manner in which the voltage of a cell (18) is restored from the reduced level to the standard level, where, in a series circuit formed of a cell (18), switch means (19) and load resistor (20), all shown in FIG. 6, the switch means (19) is closed for a load period $t_0$ and then immediately opened.

In FIG. 5, the remaining capacities of the cell (18) at different points of time have the relationship of C15>C16>C17. The dropped voltages of the cell (18) are restored in different ways illustrated by voltage curves 15, 16 and 17. In this case, lengths of time required for the reduced voltages of the cell (18) to regain the reference voltage level have the relationship of t15<t16<t17. Therefore, the remaining capacity of the cell (18) can be determined by calculating a length of time required for the dropped voltage detected at a given point of time to regain the reference voltage level. In this case, the cell capacity is expressed in units of ampere-hour. The character $\alpha$ given in FIG. 5 denotes the reference voltage level. Where the ordinary cell (18) has a voltage (E) of 1.5 volts, then the reference voltage level $\alpha$ will be set at about 1.4 volts.

The principle on which this invention is based can be easily understood from the analysis of the remaining capacities of a cell detected at different points of time which have such a relationship as C15>C16>C17 and the lengths of time required for the remaining capacities to regain the reference voltage level.

The remaining cell capacity (or the consumption of cell capacity) can be easily determined by calculating a length of time required for a cell capacity detected at a given point of time to regain the reference voltage level.

There will now be described, by reference to FIG. 6, the cell capacity detector of this invention based on the above-mentioned principle. In FIG. 6, the switch means (19) and load resistor (20) are connected in series to the cell (18). Further connected to the cell (18) is a first detector (21) for judging whether an output voltage from the cell (18) has a higher or lower level than the reference voltage level. This first detector (21) is connected a second detector (22) which, when the load resistor (20) is shut off, determines, as described in connection with FIG. 5, a length of time required for a voltage impressed across both terminals of the cell (18) to restore the reference voltage level.

The second detector (22) comprises a clock pulse generator (23) for producing a series of clock pulses and a counter (24) for counting a total number of output clock pulses from the clock pulse generator (23) and output signals from the first detector (21). A number of signals detected by the second detector (22) is displayed by digital display means (25a) or analogue display means (25b). Either means well serves the purpose. The digital display means (25a) practically comprises a decoder and driver circuit (26) and a 7-segment type display device (27).

The analogue display means (25b) comprises a D/A converter-driver circuit (28) and analogue display meter (29). The switch means (19) may include an automatic electronic switch circuit (30) in addition to a manual switch.

With the cell capacity detector of FIG. 6, the first detector (21) detects whether the cell (18) has a voltage level corresponding to the reference voltage level $\alpha$. The second detector (22) determines from a number of counter pulses the length of time required for a cell capacity detected at the release of a load to restore the reference voltage level $\alpha$. When output signals from the second detector (22) are indicated on, for example, the digital display device (25a), it is possible to easily understand the relationship of C15>C16>C17, and t15<t16<t17 described in connection with FIG. 5.

There will now be described by reference to the appended drawings the functions of the respective circuit of the cell capacity detector of this invention which are shown in the form of blocks in FIG. 6.

Figure 7:
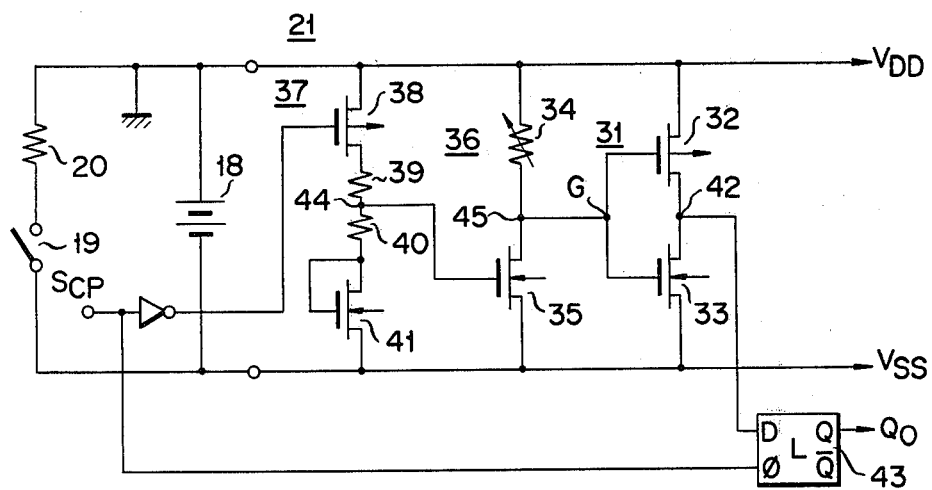
FIG. 7 sets forth the detection circuit included in the cell capacity detector of FIG. 6.

The preferred type of the first detector (21) is, for example, that shown in FIG. 7.

With the first detector of FIG. 7, a CMOS inverter circuit (31), bias circuit (36) and power-saving circuit (37) are connected in parallel between the first power supply terminal ($V_{DD}$) and second power supply terminal ($V_{SS}$) which are impressed with voltage from the cell (18). The input terminal (G) of the CMOS inverter circuit (31) is connected to the output terminal (45) of the bias circuit (36). The gate of a bias N channel transistor (35) included in the bias circuit 36 is connected to the output terminal (44) of the power-saving circuit (37).

FIG. 8A illustrates a latch circuit (43) in the form of a logic gate, and FIG. 9 shows the truth table of the latch circuit (43). With the latch circuit (43), a D input signal is sent forth as a Q output signal, only when a $\phi$ input signal has a logic level of "1". Where the $\phi$ input signal has a logic level of "0", then the Q output signal is held independently of the D input signal. Where, therefore, input pulses $S_{CP}$ has a logic level of "0", a transistor (38) is rendered nonconducting.

Consequently, even when the inverter (31) does not produce an output signal, the $Q_0$ output signal from the latch circuit (43) is held when the input pulse $S_{CP}$ has a logic level of "0". Therefore, no problem is raised. As mentioned above, the first detector (21) judges whether a voltage impressed across both terminals of the cell (18) has reached the reference voltage level. Where, with the first detector (21), the voltage of the ordinary cell is taken to be 1.5 volts, then the load resistor (20) will well serve its purpose if it has a resistance of about 150 Ω.

FIG. 8B shows a transistor circuit of the clocked complementary MOS gate type which controls the transmission of data by clock pulses $\phi$ used with the latch circuit of FIG. 8A.

The power-saving circuit (37) comprises a P channel MOS transistor (38) whose gate is supplied with clock pulses $\overline{S_{CP}}$ issued from the clock pulse generator (23) of FIG. 6; an N channel MOS transistor (41) whose drain and gate are short-circuited; and resistors (39) and (40) used for the minute adjustment of the gate bias of an N channel MOS transistor 35.

The operation of the transistor 38 is controlled by clock pulses $\overline{S_{CP}}$ supplied to the gate thereof. Therefore, current runs through the power-saving circuit (37) only when the clock pulses $\overline{S_{CP}}$ have a logic level "0", thereby effectively saving power consumption.

An output signal from the power-saving circuit (37) is supplied to the gate of the N channel MOS transistor (35) to control resistance produced between the source and drain regions thereof. The bias circuit (36) supplies the succeeding inverter (31) with a voltage level defined by the ratio which the resistance produced by the resistor (34) bears to the resistance occurring between the source and drain regions of the N channel MOS transistor (35). In other words, the output terminal (42) of the inverter (31) sends forth a signal denoting the result of judgment as to whether the voltage of the cell (the difference between voltage $V_{DD}$ and voltage $V_{SS}$) has reached the reference voltage level. The output signal from the inverter (31) is of the pulsated type, and is held by the latch circuit (43).

There will now be described the arrangement and operation of the second detector (22) shown in FIG. 10.

This second detector (22) comprises the counter circuit (24) and clock pulse generator (23) shown in FIG. 6.

Figure 10:
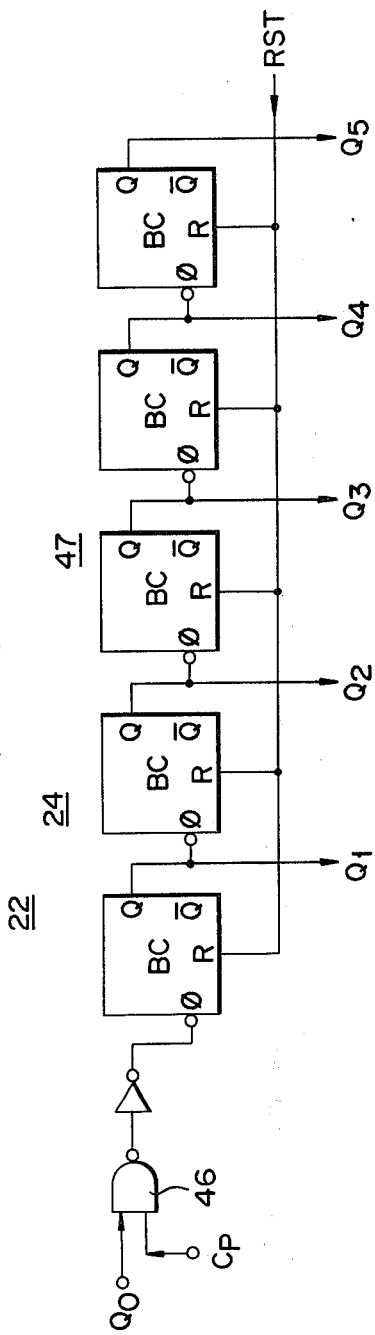
FIG. 10 indicates the counter circuit included in the cell capacity detector of FIG. 6.

The counter (24) has the arrangement shown in FIG. 10. The second detector (22) determines the length of time required for the voltage of the cell (18) detected at a given point of time to regain the reference voltage level.

The second detector (22) is supplied with an output signal $Q_0$ from the first detector (21) of FIG. 7 and clock pulses $C_P$ issued from the clock pulse generator (23) of FIG. 12. Referring to FIG. 10, these input signals are conducted through the NAND gate (46) to the counter system (47) comprising a plurality of binary counters, which in turn counts the signals received.

With the foregoing embodiment, pulses issued when the cell (18) has the normal voltage level are defined to have a maximum number of sixteen, and consequently the counter system (47) comprises five binary counters. However, said maximum number of pulses can be properly selected. In this case, it is advised to provide binary counters in a number conforming to a selected maximum number of pulses.

The counter system (47) (FIG. 10) counts output pulses from the NAND gate (46). Output signals $Q_1$, $Q_2$, $Q_3$, $Q_4$, $Q_5$ corresponding to the numbers of pulses counted by said counter system (47) are sent forth from the output terminals of the respective binary counters.

Figure 11:
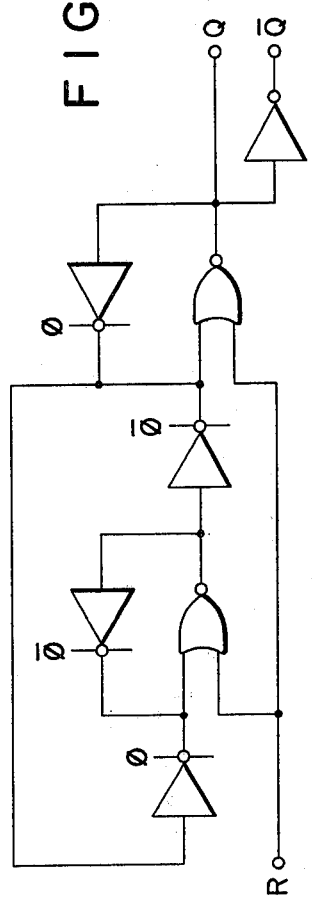
FIG. 11 shows the gates of the logic circuits used with the counter circuit of FIG. 10.

The logic gate circuits of the binary counters used with the second detector circuit (22) are indicated in FIG. 11. With each binary counter, a signal having half the frequency of an input signal $\phi$ is produced as an output signal Q. The binary counters used with the second detector circuit (22) of FIG. 10 are each so arranged as to cause the input terminal to be supplied with a signal inverted from the input signal $\phi$. Therefore, a signal marked with the symbol (circle) is supplied to the input terminal of the input signal $\phi$.

When, with the binary counter, reset input signal R has a logic level of "1", then an output signal Q has a logic level of "0", independently of the input signal $\phi$. When the second detector circuit (22) of FIG. 10 is supplied with a reset signal RST, then the contents of the counter system (47) are all cleared to return the counter system (47) to the original condition.

There will now be described the clock pulse generator (23) by reference to FIG. 12. This clock pulse generator (23) comprises a quartz oscillator (48) having a reference frequency and a frequency divider (49) for counting down the reference frequency. The quartz oscillator (48) produces a signal having a frequency of 32.768 KHz. This signal has its frequency divided by several binary counters similar to counter (49a). As a result, a signal having a frequency of 128 Hz is supplied to a latch circuit (50). Though FIG. 12 indicates only one binary counter, a large number of binary counters have to be provided in order to count down a frequency of 32.768 KHz to a frequency of 128 Hz. However, FIG. 12 omits most of them.

The circuit for binary counter (49a) is shown in FIG. 13. This binary counter (49a) has fundamentally thus same operation as that shown in FIG. 11.

Referring to FIG. 12, a signal having a frequency of 128 Hz is supplied to a latch circuits (50) and (49b). Output signals from these latch circuits (50) and (49b) respectively have a frequency of 64 Hz. An output signal $\overline{Q}$ from the latch circuit (49b) is supplied to the D input terminal of the latch circuit (50). Output signal S64 and output signal Q from latch circuit (49b) are conducted to a NOR gate (51), which sends forth an output signal $\phi_{CP}$. When NANDed with an output signal $E_{CP}$ from a switch circuit 30 (FIG. 15), the signal $\phi_{CP}$ provides signal $C_P$. When similarly NANDed with the signal $E_{CP}$ (FIG. 15), a signal S64 provides a signal $S_{CP}$.

The frequency of a signal 64 is progressively counted down by the following series of binary counters, until the frequency is reduced to 1 Hz. A signal whose frequency has thus been reduced to 1 Hz and an output signal $\overline{Q}$ from a latch circuit latched by a signal having a frequency of 128 Hz are supplied to a NOR gate (52) to provide a signal denoting 1 sec. This 1-sec signal has a frequency of 1 Hz. Unlike the ordinary 1 Hz signal, however, said 1-sec signal has the same pulse width as a signal having a frequency of 256 Hz. In this case, signal ACR is supplied as a reset signal to the respective binary counters. The signal ACR clears the contents of the binary counters to set them in the original condition.

Figure 14:
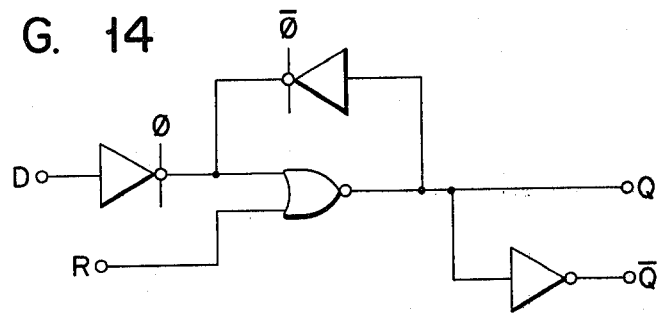

The logic gate of the latch circuit (50) of FIG. 12 is shown in FIG. 14 and has fundamentally the same function as the latch circuit 12 of FIG. 8, except that a reset input terminal is added to the latch circuit of FIG. 8. Where the latch circuit (50) is supplied with a reset signal, output signal Q from said circuit (50) has a logic level of "0", independently of input signal D.

The latch circuit (49b) of FIG. 12 is of substantially the same type as the latch circuit (50), except that input signal $\overline{\phi}$ is supplied to said latch circuit (49b). Therefore, the $\phi$ input terminal of said latch circuit (49b) is marked with the symbol o (circle) indicating a signal inversion.

There will now be described the switch circuit (30) by reference to FIG. 15. For detection of the cell capacity of the cell (18), the SW input terminal (53) of the switch circuit (30) is connected to the power supply terminal $V_{DD}$ through a switch means. An input signal supplied to the input terminal (53) of the switch circuit (30) is conducted to a delayed flip-flop circuit (54) whose $\phi$ input terminal receives an output signal 2 from the clock pulse generator (23) of FIG. 6. An output signal Q from the flip-flop circuit (54) is supplied to NOR gate (56) and as a BL (base load) signal to the base of a transistor (55) acting as switch means through an inverter and resistor. The BL signal is further conducted to a latch circuit (57) whose $\phi$ input terminal is supplied with signal 2.

An output signal $\overline{Q}$ from the latch circuit (57) is delivered to the NOR gate (56), which in turn produces signal $E_{CP}$ from a combination of the BL signal and $\overline{Q}$ output signal from the latch circuit (57). The transistor (55), supplied with the BL signal, is rendered conducting upon receipt of an input signal at the switch SW. When the transistor (55) is actuated, current runs through a series circuit constituted by the cell (18), transistor (55) and resistor (20) to slightly decrease a voltage impressed between the power supply terminals $V_{DD}$ and $V_{SS}$. The period of this voltage drop denotes the load period of FIG. 5. Later, the transistor (55) is rendered nonconducting.

When the switch SW is opened, an input signal has a voltage level $V_{SS}$ by the action of a pull-down resistor. As a result, current ceases to run through the transistor (55) and resistor (20), causing a voltage impressed between the power supply terminals $V_{DD}$ and $V_{SS}$ to increase in accordance with the detected remaining capacity of the cell (18). Further the switch signal SW renders all of the counters (47) of FIG. 10 clear.

Figure 16:
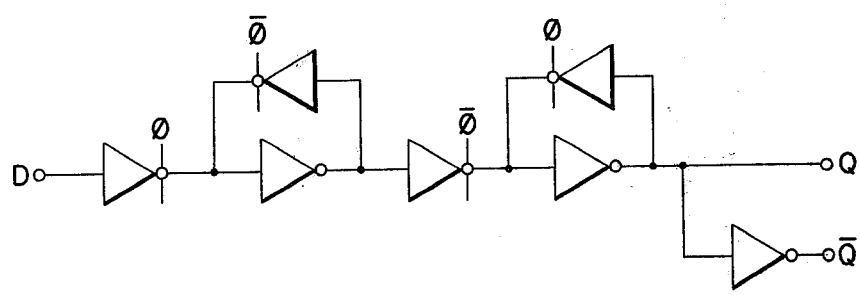
FIG. 16 indicates the gates of the logic circuits used with the switch circuit of FIG. 15.

FIG. 16 shows the arrangement of the logic gate circuit of the delayed flip-flop circuit (54) used with the cell capacity detector of this invention. The flip-flop circuit (54) shifts a D input signal to the output terminals Q and $\overline{Q}$ in turn upon receipt of a $\phi$ signal.

Figure 15:
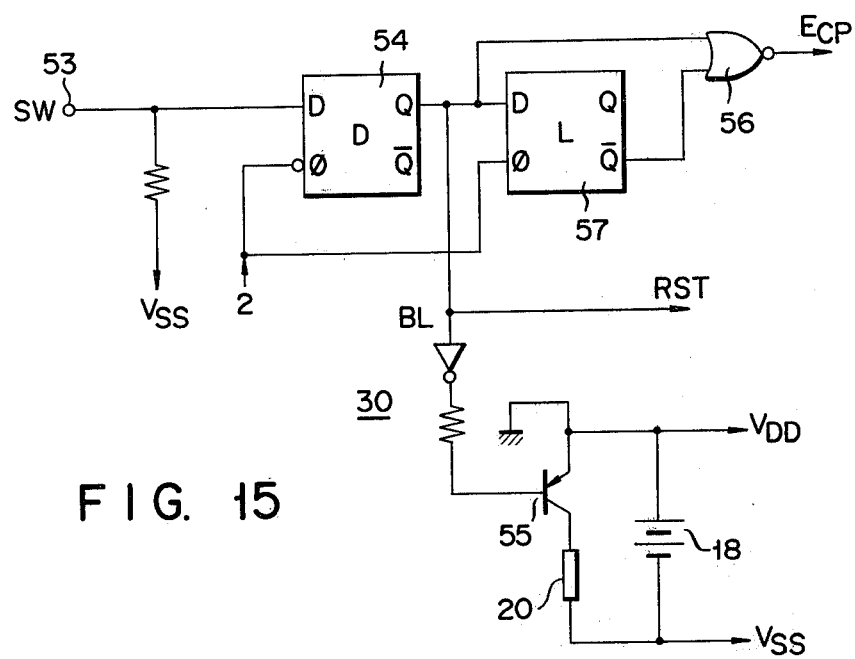
FIG. 15 shows the switch circuit used with the cell capacity detector of FIG. 6.
Figure 17:
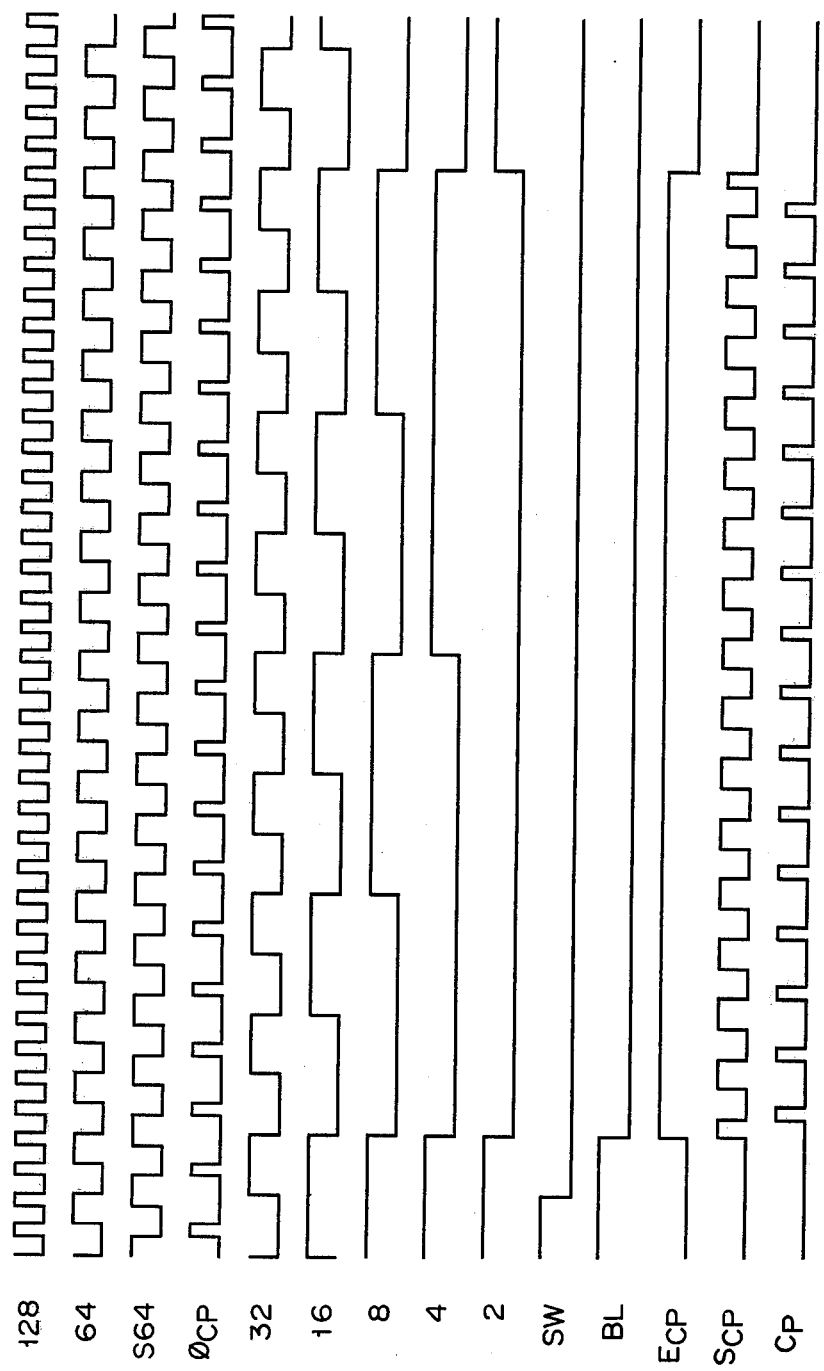
FIG. 17 illustrates the waveforms of signals generated in the circuits of FIGS. 12 and 15.

The operation of the clock pulse generating circuit (23) of FIG. 12 and the switch circuit (30) of FIG. 15 will be better understood with reference to FIG. 17 indicating the waveforms of signals produced at the various sections of said circuits. As seen from FIG. 17, the signal $\phi_{CP}$ has a frequency of 64 Hz, but, unlike the ordinary signal, has a width equal to a phase displacement between the signals S64 and 64. The signal BL denotes an output signal from the delayed flip-flop circuit (54) supplied with the switch signal SW and signal 2. The transitor (55) is rendered conducting or nonconducting according to the contents of the signal BL. The signal BL and $\overline{Q}$ output signal from the latch circuit (57) are supplied to the NOR gate (56) (FIG. 15) to produce the signal $E_{CP}$. When NANDed with the signal $\phi_{CP}$, the signal $E_{CP}$ provides the signal $C_P$. The signal $C_P$ is used to count a length of time required for a voltage impressed between the power supply terminal $V_{DD}$ and $V_{SS}$ to regain the reference voltage level after the transistor (55) acting as switch means is rendered nonconducting, and consequently supplied to the counter circuit (24) of FIG. 10. The signal $S_{CP}$ is produced when the signal S64 is NANDed with the signal $E_{CP}$, and is delivered to the detector circuit (21).

Figure 18:
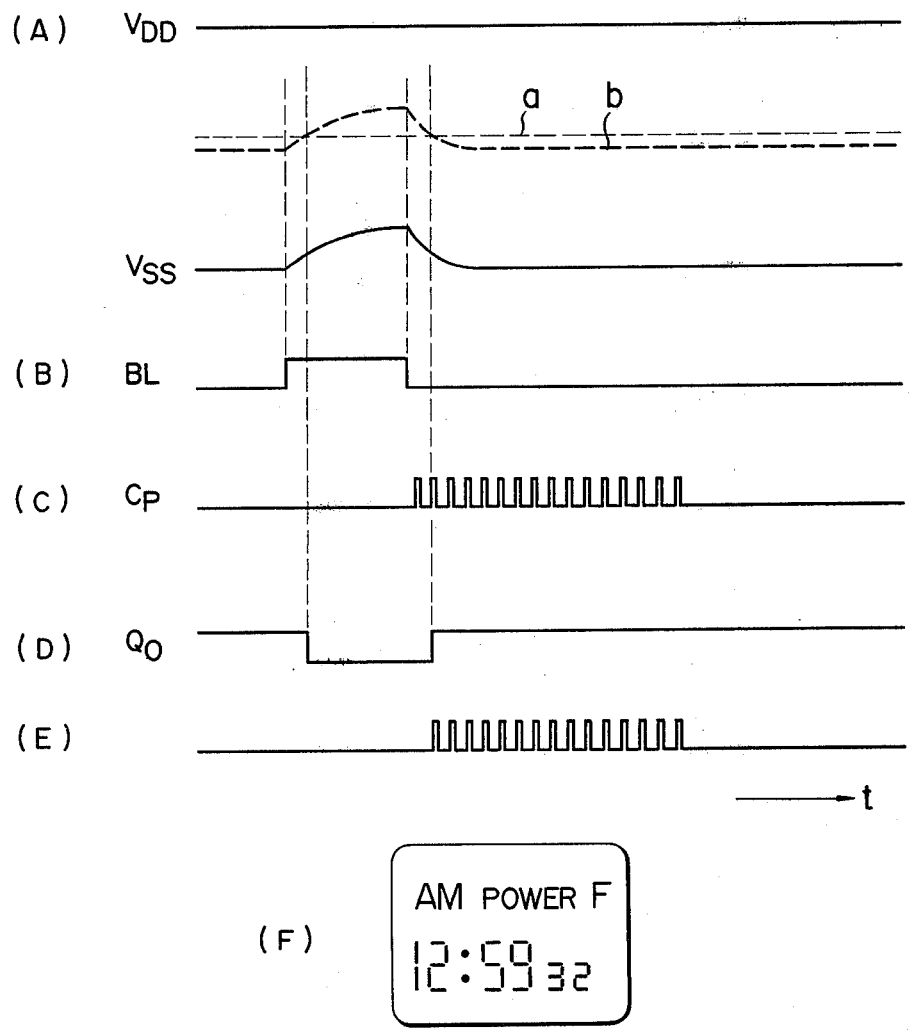
FIGS. 18(A–F) and 19(A–F) are time charts illustrating the operation of the cell capacity detector of the invention.

There will now be described by reference to FIG. 6 the operation of a cell capacity detector embodying this invention. FIG. 18 is a timing chart illustrating the operation of the cell capacity detector when the cell (18) has a sufficient capacity. The switch circuit (30) of FIG. 15 sends forth a signal instructing the detection of the capacity of the cell (18) to the switch means 19 (FIG. 6).

When supplied with said instruction, the switch means (19) is rendered conducting, and current flows through the resistor (20). At this time, the signal BL of FIG. 18(B) rises to a high level. Thus, the voltage level of the power supply terminal $V_{SS}$ rises as shown in FIG. 18(A). Where the voltage of this power supply terminal $V_{SS}$ rises to a saturated point, the signal BL which is now made to have a low voltage level renders the switch means (19) nonconducting. With the foregoing embodiment, the supply of this load consumes several seconds. Then current ceases to flow to the resistor (20), causing the voltage of the power supply terminal $V_{SS}$ to fall to the normal level. This voltage drop processes at a speed varying with the capacity of the cell (18). Where the cell (18) has a sufficient capacity, the voltage quickly drops. However, the voltage falls more slowly, according as the capacity of the cell (18) is decreased, as described in connection with FIG. 5.

The broken line b of FIG. 18(A) denotes a signal varying with the voltage level of the power supply terminal $V_{SS}$. The broken line b indicates the waveform of an output voltage signal from the bias circuit (36) included in the detector circuit (21) of FIG. 7. This signal actually has a pulse-like waveform as described in connection with the circuit of FIG. 7, but is indicated in the form of FIG. 18(A) for convenience of description.

The broken line a of FIG. 18(A) represents the threshold voltage of the inverter (31) included in the detector circuit (21) of FIG. 7. In other words, the voltage level of the power supply terminal $V_{SS}$ determines whether the corresponding voltage level of the bias circuit (36) is higher or lower than the threshold voltage level of the inverter (31). The inverter (31) sends forth an output signal denoting the result of said determination. This output signal is held by the latch circuit (43), which generates a signal $Q_0$ shown in FIG. 18(D).

Where the signal BL falls, sixteen clock pulses $C_P$ shown in FIG. 18(C) are produced, as easily understood from the description of the clock pulse generator (23) of FIG. 12.

The clock pulses $C_P$ NANDed with the signal $Q_0$ is shown in FIG. 10 are supplied to the counter (47). With the foregoing embodiment, the number of the clock pulses $C_P$ is previously chosen to be sixteen. Obviously, number of said clock pulses can be optionally defined. A signal consisting of the clock pulses $C_P$ NANDed with the signal $Q_0$ is issued through NAND gate (46) in the form shown in FIG. 18(E). Namely, a series of fifteen clock pulses is produced. This event results from the quick restoration of the voltage level of the power supply terminal $V_{SS}$. Where the fifteen clock pulses are counted by the counter (47), then the $Q_5$ output signal alone has a logic level of "0", and the other output signal $Q_1$, $Q_2$, $Q_3$, $Q_4$ have a logic level of "1".

Since, in the above-mentioned case, the cell (18) has a full capacity, the display device (27) indicates the character (F) given in FIG. 18(F).

Figure 19:
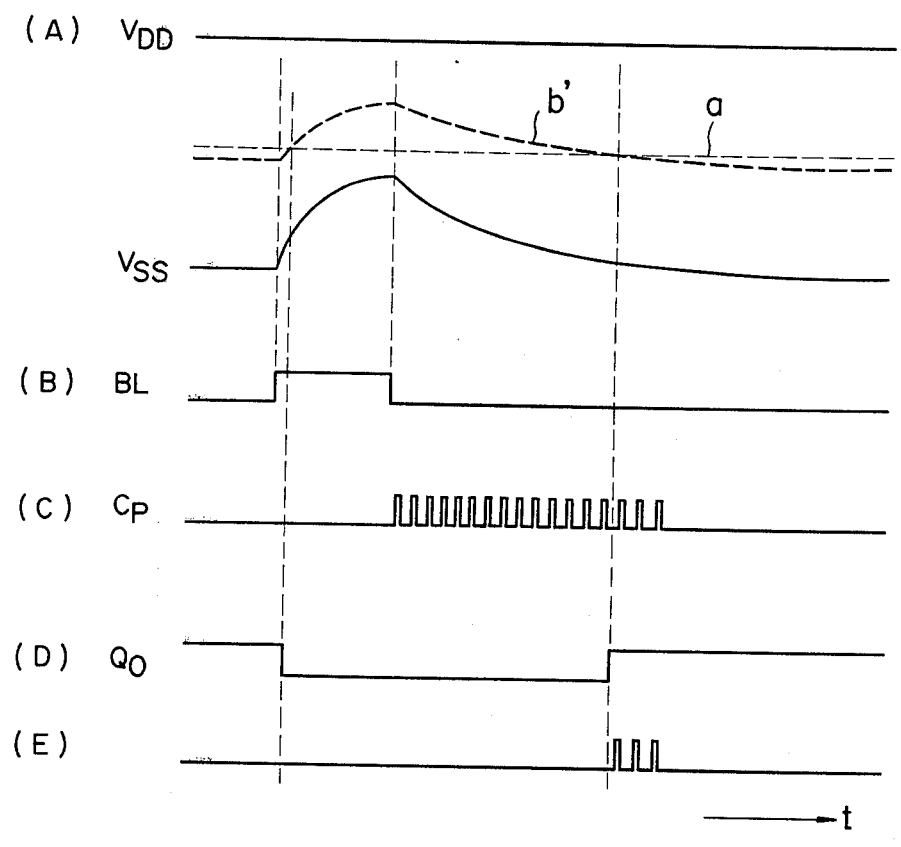

FIG. 19 is a timing chart given by way of illustrating the manner in which the reduced capacity of the cell (18) is detected. The fundamental operation indicated by FIG. 19 is substantially the same as that of FIG. 18. The operation represented by FIG. 19 is different from that of FIG. 18 in that since the capacity of the cell (18) is decreased, great resistance appears in the cell (18). Where, therefore, the resistor (20) is connected as a load, the internal voltage drop leads to a prominent voltage drop at both ends of the cell (18). Where current ceases to flow to the load of the resistor (20), then a length of time required for a broken line denoting an output signal b' (FIG. 19) from the bias circuit (36) of FIG. 7 to cross a broken line representing the threshold voltage a is extended longer than in the case of FIG. 18.

Therefore, only three of the sixteen clock pulses $C_P$ of FIG. 19(C) are sent forth when NANDed with the signal $Q_0$ of the FIG. 19(D). These three clock pulses $C_P$ are counted in the succeeding circuit for display, thereby indicating that the cell (18) has a small remaining capacity. Namely, a numeral "3" is displayed as illustrated in FIG. 19(F).

FIG. 19(B) shows a period in which current continues to flow through a load. This period corresponds to the signal BL. In the case of FIG. 19, the capacity of the cell (18), is considerably depleted as previously described. Therefore, the voltage of the power supply terminal $V_{SS}$ of the cell (18) has a slightly higher level than the case of FIG. 18.

Referring to FIGS. 18 and 19, clock pulses were counted after the voltages of the power supply terminals at both ends of the cell (18) reached the reference level. However, the same effect can be attained by counting a number of clock pulses which are issued until the reference voltage level is reached. In other words, one clock pulse is counted in the case of FIG. 18, and thirteen clock pulses are counted in the case of FIG. 19.

There will now be described a concrete example of the display means (25a) of FIG. 6. This display means (25a) comprises a decoder-driver circuit (26) of FIG. 20 and display device (27). The display means (25a) are supplied with output signals $Q_1$, $Q_2$, $Q_3$, $Q_4$ and $Q_5$ from the counter (47) of FIG. 10. These signals are made to correspond to the input-output data of FIG. 21. Actually, the decoder-driver circuit (26) is operated as a read-only memory (ROM). Output signals a, b, c, d, e, f and g from the decoder-driver circuit (26) are supplied to 7-segment type light-emitting diodes (LED) or liquid crystal devices (LCD) for their actuation. Where all the output signals $Q_1$, $Q_2$, $Q_3$, $Q_4$ and $Q_5$ have a logic level of "0", that is, where the clock pulses are not counted, then the cell (18) has substantially little capacity. As a result, a character "E" is shown on the display device (27). Where more than ten clock pulses are counted, then it means that the cell (18) still retains a considerable capacity. In this case, the display device (27) indicates a character "F". Therefore, the user of a portable implement, for example, a watch provided with such cell capacity detector can easily recognize how much the cell capacity has been consumed.

A concrete example of a display device is illustrated in FIG. 22. This display device indicates a current time as 12 hr 53 min and aside thereof the character "F" denoting that the cell (18) still has a sufficient capacity. In this case, the process of displaying the character "F" upon receipt of more than 10, 11 or 15 selected clock pulses is closely related to the frequency of the clock pulses and the total number of clock pulses issued. Therefore, the relationship between the total counted number of clock pulses and the number of clock pulses selectively used the display the character "F" should be determined in advance.

The switch circuit (30) of FIG. 15 represents the case where a switch signal SW is supplied through a manual switch. In contrast, FIG. 23 indicates the case where signals produced in the various counter circuits included in a watch are utilized for automatic switch function. With the switch circuit of FIG. 23, an input terminal 58 is supplied with a signal 1SEC issued from the clock pulse generator (23) of FIG. 12. The signal 1SEC is conducted to a "second" counter. Output signals successively actuate the following "minute" counter, "day" counter and "month" counter in the order mentioned. These counters display a current point of time.

Figure 23:
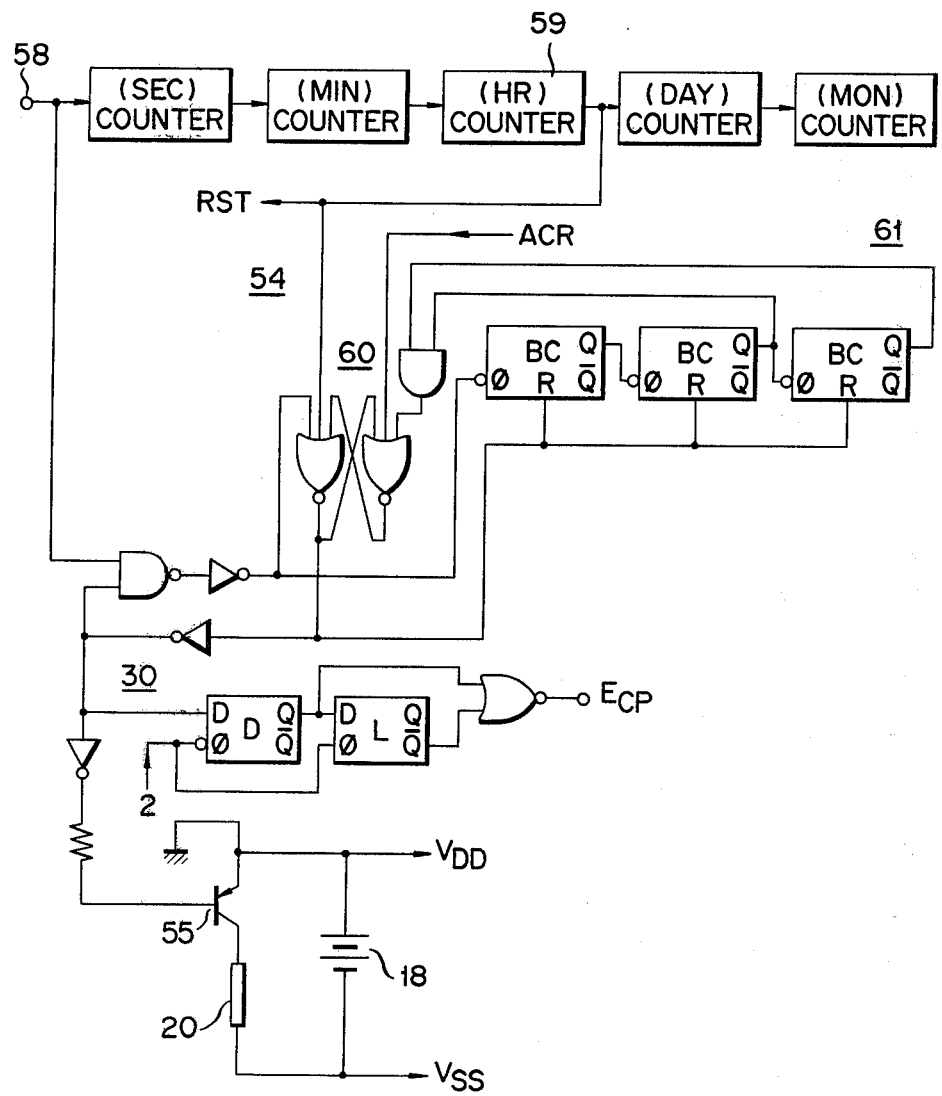
FIG. 23 shows the arrangement of the switch circuit of FIG. 15 which is automatically actuated once a day.

An output signal from the "hour" counter is temporarily stored in a flip-flop circuit (60). An output signal from said flip-flop circuit (60) controls a counter system (61) formed of a group binary counters which are each supplied with a signal 1SEC having a frequency of 1 Hz. An output count signal from the counter system (61) is fed back to the flip-flop circuit (60) to reset it. An output signal issued at this time provides the signal BL to render the transistor (55) acting as switch means conducting or nonconducting as need arises. The clock pulse generator (23) of FIG. 23 includes the same type of circuit as that of FIG. 15 which produces a signal $E_{CP}$ from the signal BL and signal 2. Referring to FIG. 23, the signal ACR denotes a manual signal used to clear the flip-flop circuit (60), and the signal RST is used to clear the counter (47) of FIG. 10 once a day.

According to the clock pulse generator (23) of FIG. 23, the capacity of a cell (18) is detected once a day, and a detected cell capacity is stored in the counter of FIG. 10, thereby displaying the cell capacity for each day. The load period is set at several seconds as apparent from the circuit arrangement of FIG. 23.

The prior art cell capacity detector only determined an abnormal voltage drop. In contrast, the cell capacity detector of this invention clearly indicates the momentarily changing cell capacity at a glance, and offers the advantages that it is possible to eliminate the occurrence of the undesirable event that the user of for example, a portable watch provided with a cell suddenly notices the abnormal voltage drop of the cell; the user can always replace the used cell for a fresh one in accordance with the detected depletion of the capacity of the old cell, and is afforded the feeling of great safety; and since said replacement is effected in good time by previously recognizing the limit cell capacity, there is no possibility of the watch operation being carelessly stopped during the replacement as is often the case with the prior art cell capacity detector.

It is to be noted that this invention is not limited to the above-mentioned embodiment, but can obviously be practised in various modification falling within the claimed object and scope of the invention.

The foregoing description refers to the case where the cell capacity detector of the invention was applied to a portable watch. If the very large scale integration (VLSI) process is further developed, then the cell capacity detector of the invention can of course be applied not only to a photographic camera but also any other portable implement. With the cell capacity detector of the invention, clock pulses can obviously be counted during the abnormal voltage drop of a cell.

What is claimed is:

1. A detector for determining the capacity of a cell, said detector comprising:
   (a) load means;
   (b) switch means between said cell and said load means for connecting and disconnecting said cell from said load means, the connection of said cell to said load means causing said cell voltage to drop; and
   (c) means to measure the time for the voltage of said cell to recover from said dropped cell voltage after said disconnection of said cell from said load means.

2. A detector for determining the capacity of a cell, said detector comprising:
   (a) load means;
   (b) switch means between said cell and said load means for connecting and then disconnecting said cell from said load means, the connection of said load means to said cell causing said cell voltage to drop;
   (c) means connected to said cell for detecting when said cell voltage equals a preset reference level after said switch means disconnects said cell from said load means; and
   (d) means connected to said detecting means for determining the restoration time of said cell by measuring the time between the disconnection of said cell from said load means by said switch means and the moment when said detecting means first indicates that said cell voltage equals said preset reference level.

3. The cell capacity detector in claim 2 wherein said restoration time determining means further comprises:
   (a) a clock pulse generator producing a series of clock pulses; and
   (b) a counter for counting the clock pulse generator pulses in response to signals from said detector means and said switch means.

4. The cell capacity detector in claim 3 wherein said restoration time determining means includes means to count said clock pulses issued by a said clock pulse generator only after said detecting means indicates that said cell voltage equals said preset reference voltage.

5. The cell capacity detector in claim 2 or 4 further comprising display means connected to said restoration time determining means for indicating a capacity of said cell.

6. The cell capacity detector in claim 2 further comprising means for periodically activating said switch means to begin said cell capacity detection and means for storing the results from said restoration time determining means until the next activation of said switch means.

7. The cell capacity detector in claim 5 further comprising means for periodically activating said switch means to begin said cell capacity detection and means, connected to said display means, for storing the results from said restoration time determining means until the next activation of said switch means.

8. The cell capacity detector of claim 2, wherein said detecting means further comprises:
 (a) inverter circuit means connected across the positive and negative terminals of said cell, the output of said inverter circuit indicating the relationship between said cell voltage and said preset reference voltage; and
 (b) a bias circuit connected across said cell terminals, the output of said bias circuit being connected to the input of said inverter circuit means, said bias circuit generating a signal to indicate whether said cell voltage is equal to said preset voltage.

9. The cell capacity detector in claim 8 wherein said detecting means further comprises a power saving circuit connected in parallel with said cell, said power saving circuit including an output terminal connected to an input of said bias circuit and including:
 (a) a first transistor having a source connected to one terminal of said cell and having a gate connected to said restoration voltage determining means;
 (b) resistance means having two end terminals and an intermediate terminal, one of said end terminals being connected to the drain of said first transistor and said intermediate terminal being connected to said output terminal of said power saving circuits; and
 (c) a second transistor having its gate and drain connected to the other end terminal of said resistance means and having a source connected to the other terminal of said cell.

10. The cell capacity detector of claim 8 or 9 further comprising means for generating a binary signal in response to the output of said inverter circuit means to indicate the relationship between said cell voltage and said preset reference voltage.

* * * * *